(12) United States Patent
Hall et al.

(10) Patent No.: US 9,054,251 B1
(45) Date of Patent: Jun. 9, 2015

(54) SOLAR COLLECTOR ARRAY

(75) Inventors: John Champlin Hall, Rancho Palos Verdes, CA (US); Guy Lawrence Martins, Downey, CA (US)

(73) Assignee: The Boeing Company, Chicago, IL (US)

( * ) Notice: Subject to any disclaimer, the term of this patent is extended or adjusted under 35 U.S.C. 154(b) by 396 days.

(21) Appl. No.: 13/193,058

(22) Filed: Jul. 28, 2011

(51) Int. Cl.
*H01L 31/052* (2014.01)

(52) U.S. Cl.
CPC ................... *H01L 31/052* (2013.01)

(58) Field of Classification Search
CPC ........... H01L 31/0224; H01L 31/0232; H01L 31/02325; H01L 31/048; H01L 31/0485–31/486; H01L 31/05; H01L 31/0504; H01L 31/052; H01L 31/0522
USPC .................................................. 136/246, 259
See application file for complete search history.

(56) References Cited

U.S. PATENT DOCUMENTS

| | | | |
|---|---|---|---|
| 4,150,663 A | 4/1979 | Sisson | |
| 4,223,174 A | 9/1980 | Moeller | |
| 4,350,837 A | 9/1982 | Clark | |
| 5,096,505 A * | 3/1992 | Fraas et al. ..................... | 136/246 |
| 5,180,441 A | 1/1993 | Cornwall et al. | |
| 5,255,666 A | 10/1993 | Curchod | |
| 5,344,496 A | 9/1994 | Stern et al. | |
| 5,409,550 A | 4/1995 | Safir | |
| 2003/0063888 A1 | 4/2003 | Sahlin et al. | |
| 2003/0075212 A1 | 4/2003 | Chen | |
| 2006/0185713 A1 | 8/2006 | Mook | |
| 2006/0193066 A1 | 8/2006 | Prueitt | |
| 2006/0266408 A1 * | 11/2006 | Horne et al. .................. | 136/246 |
| 2008/0185040 A1 * | 8/2008 | Tom et al. ...................... | 136/259 |
| 2008/0223443 A1 | 9/2008 | Benitez et al. | |
| 2008/0251113 A1 | 10/2008 | Horne et al. | |
| 2008/0308152 A1 | 12/2008 | Grip | |
| 2010/0037936 A1 * | 2/2010 | Becker et al. ................. | 136/248 |
| 2010/0275972 A1 | 11/2010 | Benitez et al. | |

FOREIGN PATENT DOCUMENTS

| | | |
|---|---|---|
| DE | 102006009412 | 8/2007 |
| EP | 1835547 | 9/2007 |
| WO | 2007/117136 | 10/2007 |

OTHER PUBLICATIONS

Plesniak, A. et al., "High Performance Concentrating Photovoltaic Module Designs for Utility Scale Power Generation," submitted for the PVSC34 Proceedings, Jun. 7-12, 2009, and SPIE Optics and Photonics, Aug. 2-6, 2009.
Plesniak, A., Oral Presentation entitled "High Performance Concentrating Photovoltaic Module Designs for Utility Scale Power Generation," PVSC34 Proceedings, Jun. 7-12, 2009, and SPIE Optics and Photonics, Aug. 2-6, 2009.

(Continued)

*Primary Examiner* — Golam Mowla
(74) *Attorney, Agent, or Firm* — Diane M. Tsuda

(57) ABSTRACT

A method and apparatus for efficient manufacture, assembly and production of solar energy. In one aspect, the apparatus may include a number of modular solar receiver assemblies that may be separately manufactured, assembled and individually inserted into a solar collector array housing shaped to receive a plurality of solar receivers. The housing may include optical elements for focusing light onto the individual receivers, and a circuit for electrically connecting the solar receivers.

8 Claims, 8 Drawing Sheets

(56) References Cited

OTHER PUBLICATIONS

Plesniak, A., Oral Presentation entitled "Demonstration of High Performance Concentrating Photovoltaic Module Designs for Utility Scale Power Generation," presented at ICEPAG 2009 (Feb. 10-12, 2009).

Plesniak, A., Poster panel entitled, "Demonstration of High Performance Concentrating Photovoltaic Module Designs for Utility Scale Power Generation," presented at ICSC5 (Nov. 16-19, 2008).

"Solar Thermal Propulsion (STP)," website of SRS Technologies, http:web.archive.org/web/20030122205006/http://www.stq.srs.com/atd/STP.htm 2 pages), Feb. 13, 2009.

DeScioli, D., "Soliant Energy," Soliant Energy, Inc. (24 pages) (2007).

Web page of Soliant Energy, Inc. http://www.soliant-energy.com/products.php (2 pages), Feb. 17, 2009.

"Products. Amonix 7700 Solar Power Generator," web page of Amonix, http://www.amonix.com/amonix_products.html (3 pages), Aug. 12, 2009.

"Sunflower Technology," web page of Energy Innovations, Inc., http://www.energyinnovations.com/sunflower/technology.html (2 pages), Aug. 12, 2009.

Product literature, "Sunflower. Fully-Integrated, Smart CPV," by Energy Innovations, Inc. (2 pages) (2008).

Horne, S. et al., "A Solid 500 Sun Compound Concentrator PV Design," Conference: Photovoltaic Energy Conversation, Conference Record of the 2006 IEEE 4th World Conference, vol. 1 (4 pages) (2006).

\* cited by examiner

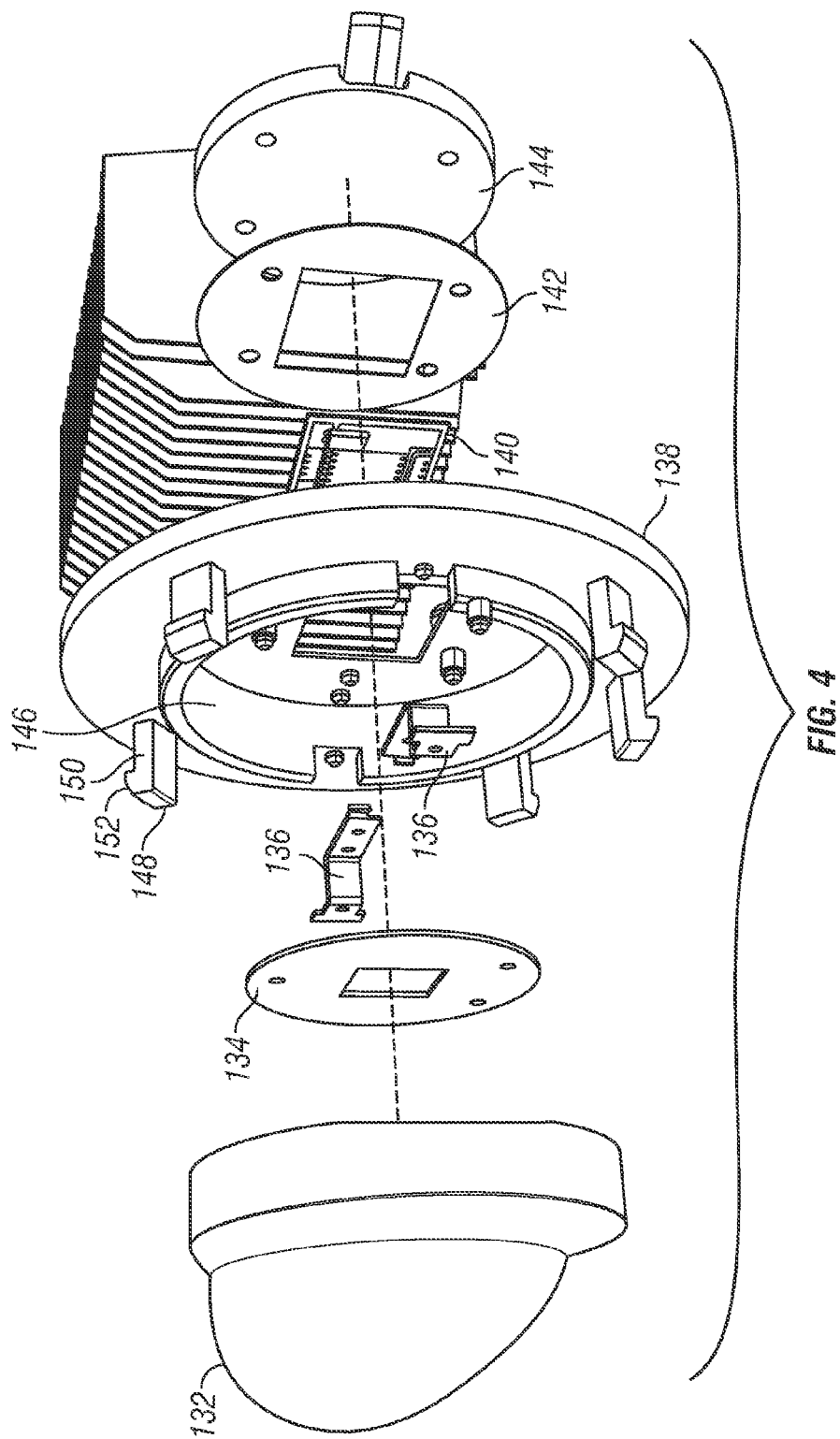

SOLAR COLLECTOR ARRAY

GOVERNMENT LICENSE RIGHTS

This invention was made with Government support under Contract No. DE-FC36-07G017052 awarded by the Department of Energy. The government has certain rights in this invention.

BACKGROUND

The present invention relates to methods for generating solar energy, and more particularly, to modular solar arrays having electrically interconnected solar collectors for generating solar energy.

Solar power is becoming an increasingly important component of electricity production. However, due to the diffuse nature of solar energy, it is necessary to concentrate solar energy in order to generate electrical power. Photovoltaic solar concentrators typically are used to generate electrical power by concentrating sunlight onto photovoltaic devices by means of lenses which concentrate solar energy onto electricity-producing solar cells. By concentrating sunlight from a large area onto a relatively small area, high efficiency solar cells, such as gallium arsenide-based ("GaAs") solar cells may be used in place of less efficient silicon solar cells, thereby producing more energy per unit area.

While improved efficiency can increase the energy production per unit area, the relatively small amount of electricity generated per unit area (compared to fossil fuel or nuclear electricity sources) requires a large number of solar cells distributed over a wide area. Therefore, a number of solar collectors must be assembled and placed in order to generate a meaningful amount of electricity.

One method of providing energy is the use of multiple solar collectors within one housing unit to create a solar collector array, such as that described in U.S. Publication No. 2010/0275972 to Benitez, et al., herein incorporated in its entirety. The housing unit provides thermal and environmental protection for the solar collectors as well as providing an optical element that concentrates solar energy onto a solar cell. Each individual solar cell is electrically connected to an adjoining cell in series, thereby providing a large voltage drop across the entire solar collector array.

A concern with this type of assembly is the high degree of accuracy that is required to align the solar cells within the housing unit. Incident solar energy must be carefully controlled to impact a relatively small area on the solar cell. This results in a high manufacturing cost to accurately align an array of solar cells to one another and to individual optical elements on the housing unit.

A further complication present in prior art devices is the need to electrically couple adjacent solar cells. This electrical connection is required to be located within the thermal and environmental protection of the housing unit due to the very high voltage above ground that may pass through the connection, and to lessen the risk of damage to the electrical connection, which may reduce the amount of power generated. Further, these electrical connections are required to be relatively robust to carry high levels of electrical current generated by the solar collectors.

Finally, while the solar collector may receive a large amount of incident solar radiation, solar cells typically are able to convert only approximately 30% to 60% of such radiation to electricity. The remaining incident radiation is converted to heat that must be dissipated.

It is the object of the present invention to overcome these and other problems identified in the prior art.

SUMMARY OF THE INVENTION

In one aspect, a solar collector array may include a housing, a modular solar collector, and a seal between the housing and solar collector. The housing may include a first optical element and a receiver plate with the receiver plate including openings for receiving the modular solar collector and an electrical element for transmitting power between and from the modular solar collectors. The solar collector may be inserted into the opening and may include an electrical connector that engages the electrical element. The seal may provide a thermal and environmental barrier between the collector and housing, while maintaining a thermal connection through the housing.

Further aspects of the disclosed solar array may include a photovoltaic cell on the solar collector, a second optical element on the solar collector, and a heat sink on the solar collector in thermal communication with the photovoltaic cell.

Also disclosed is a novel method of manufacturing a solar collector from an environmentally enclosed housing and a solar collector. The housing includes an optical element and an electrically conductive pathway extending between openings in the housing for transmitting electricity therefrom and therebetween. The solar collector may include a heat sink, a photovoltaic cell in contact with the heat sink, an optical element for focusing solar energy onto the cell, a receiver for coupling the collector to the housing and an electrical connector. A portion of the receiver may be inserted into the opening and coupled to the housing. The electrical connector then may be electrically coupled to the electrically conductive pathway and the components are sealed together to provide protection from the ambient.

Other aspects of the disclosed solar array may include making the connector a spring-biased clip and providing a receiver shaped to engage the housing mechanically and provide an electrical connection between the solar collectors and housing.

In a further aspect, a method of generating solar energy includes providing a solar collector with a housing and modular solar collectors such as those described above. The receiver of the modular solar collector is inserted into the housing and twisted to couple the modular solar collector to the housing mechanically, and at the same time, electrically connect the solar collector to the circuit of solar collectors contained within the housing. Incident solar radiation is focused through a first optical element in the housing onto the second optical element and through the second optical element onto a photovoltaic cell. Electrical energy is then transferred from the photovoltaic cell to a clip and from the clip to an electrical path within the housing, thereby providing a source of solar generated electricity.

The features, functions, and advantages that have been discussed can be achieved independently in various embodiments of the present invention or may be combined in yet other embodiments further details of which can be seen with reference to the following description and drawings.

BRIEF DESCRIPTION OF DRAWINGS

FIG. 4 is an exploded, perspective view of a receiver assembly for the solar collector array of FIG. 1;

DETAILED DESCRIPTION

Figure 1:
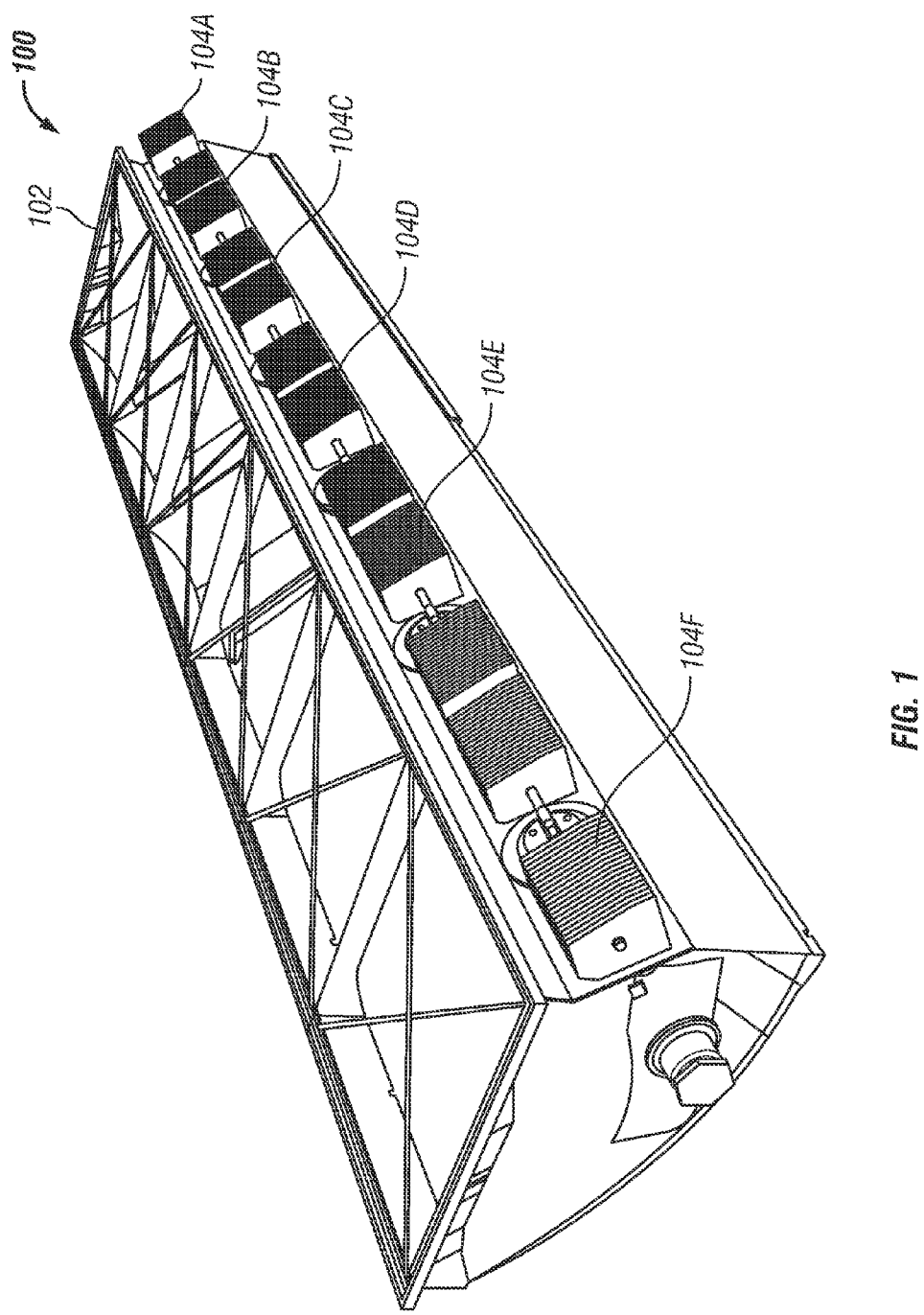
FIG. 1 is a perspective view of one embodiment of the disclosed solar collector array.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

As shown in FIG. 1, the solar collector array 100 may include a housing 102 and a number of receiver assemblies 104A-F (generally referred to as 104). The solar collector array 100 as shown in this figure includes six receiver assemblies 104A-F, although the number of receiver assemblies 104 may be varied according to need.

Figure 2:
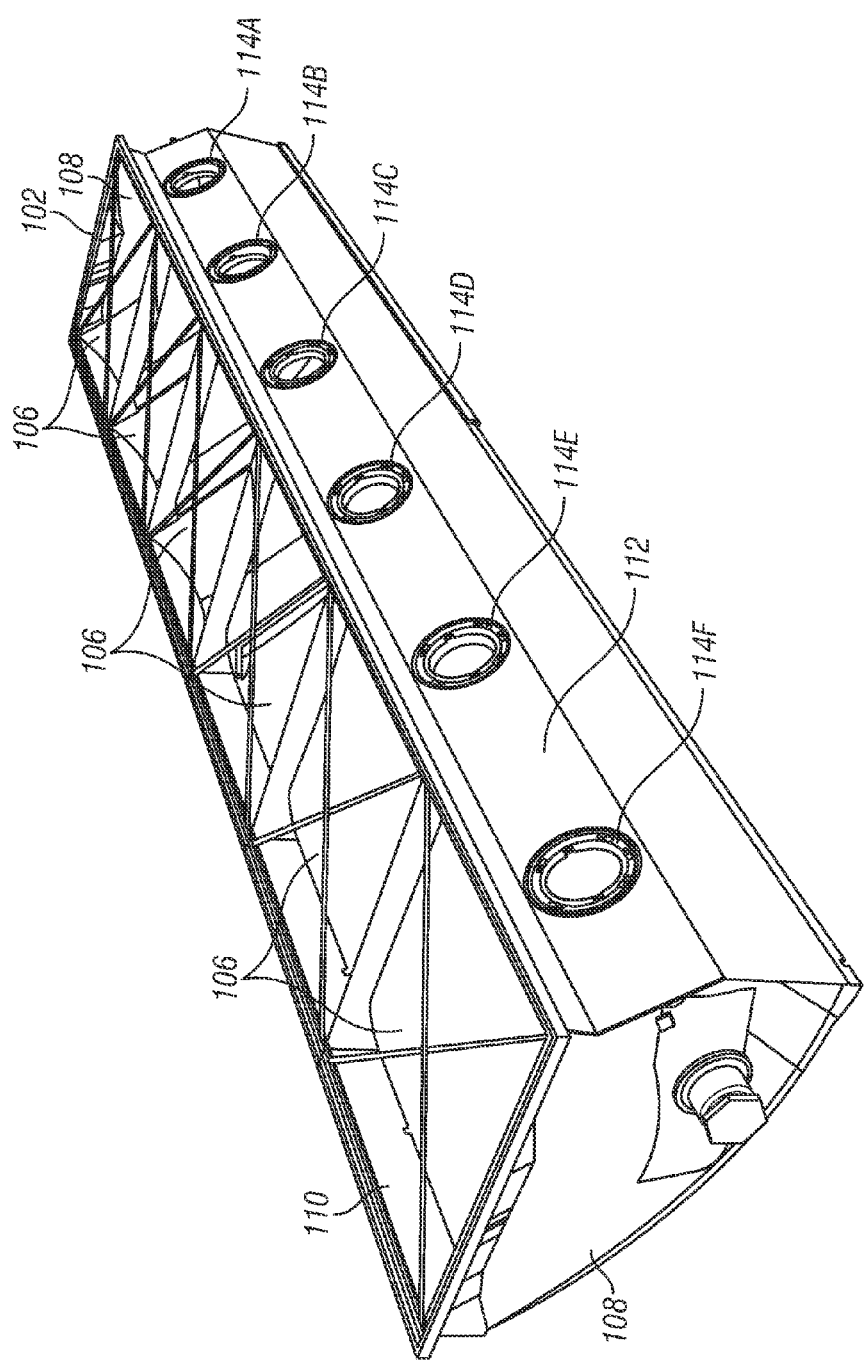
FIG. 2 is a perspective view of a housing for the solar collector array of FIG. 1.

FIG. 2 illustrates the housing 102 that may include optical elements 106, side walls 108, back 110, and a receiver plate 112. The receiver plate 112 includes a number of receiver interfaces 114A-F (generally referred to as 114) that receive corresponding receiver assemblies 104A-F (FIG. 1).

Figure 3A:
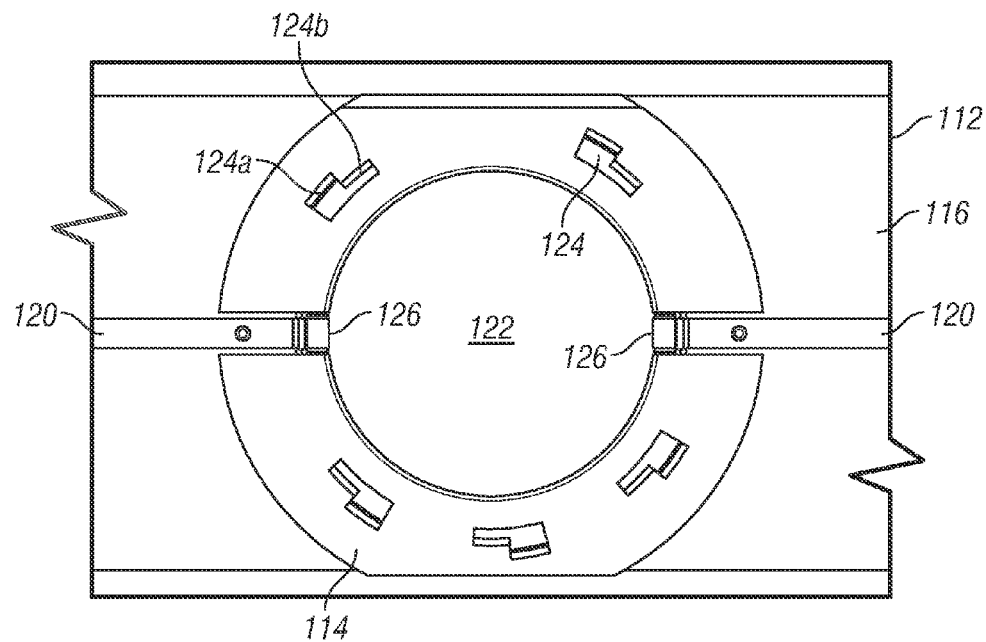
FIG. 3A is a top perspective view of a receiver plate of the housing of FIG. 2.
Figure 3B:
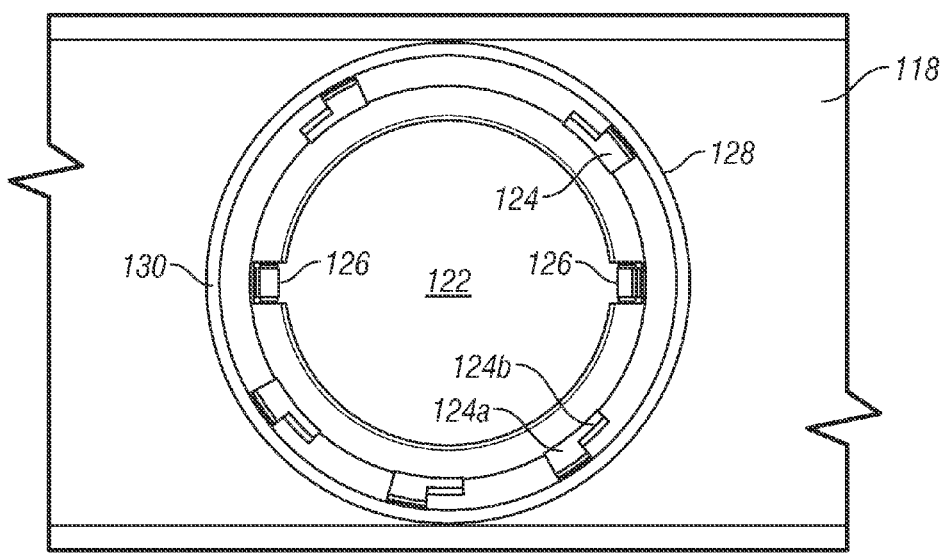
FIG. 3B is a bottom perspective view of the receiver plate shown in FIG. 3A.
Figure 6A:
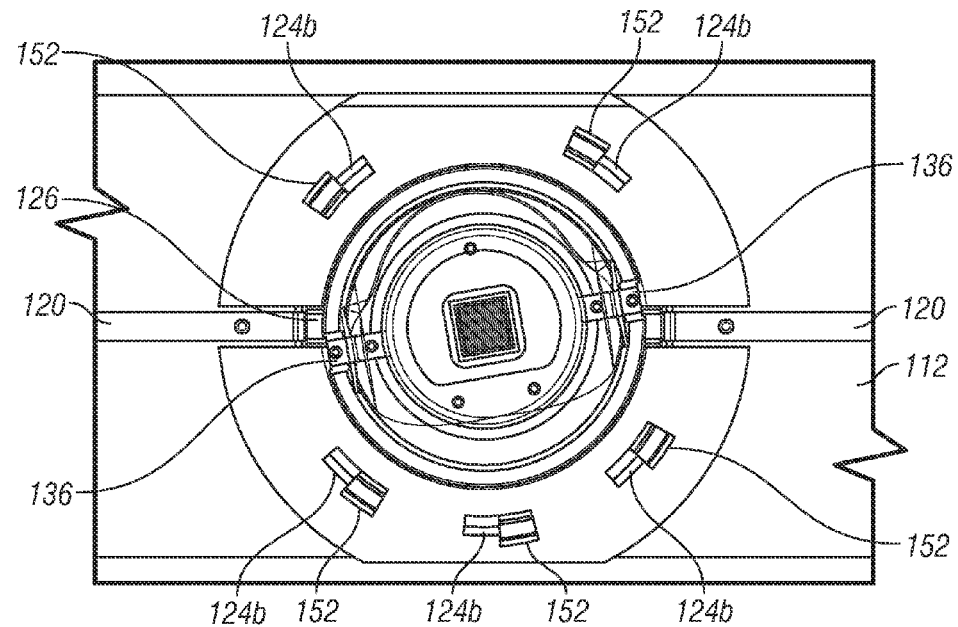
FIG. 6A is a top perspective view showing the attachment of the receiver assembly to the receiver plate.
Figure 6B:
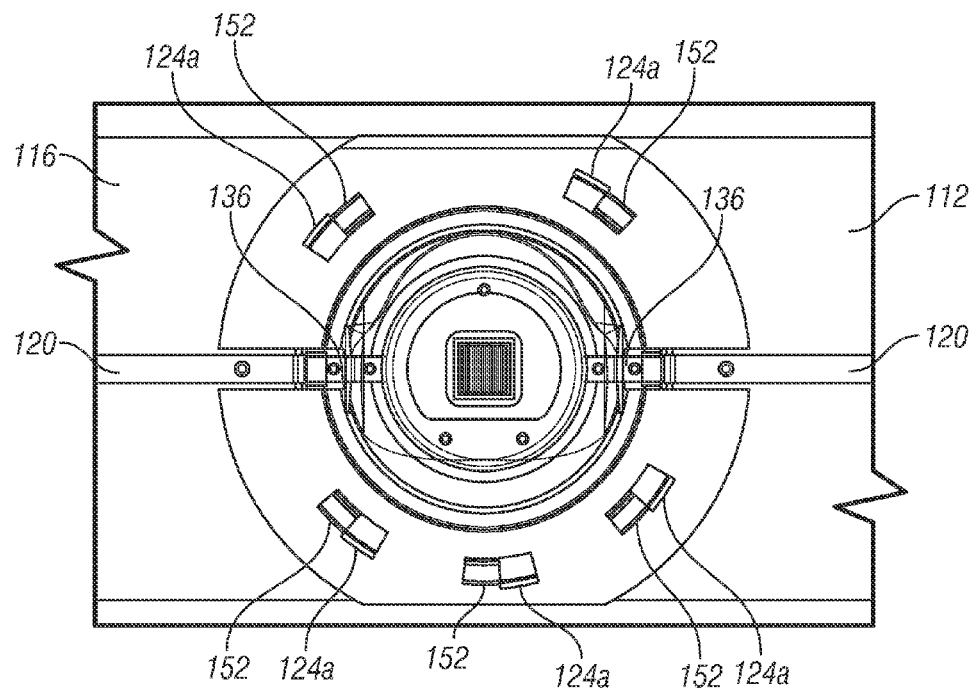
FIG. 6B is a top perspective view showing the attachment of the receiver assembly to the receiver plate.

FIGS. 3A and 3B show an individual receiver interface 114 that may be located on the receiver plate 112. The receiver plate 112 includes an inside surface 116 that faces the interior of the housing 102 (FIG. 2) and an outside surface 118 facing away from the housing 102. As shown in FIG. 3A, the inside surface 116 includes a conductor 120 that runs substantially the length of the receiver plate 112 and is interrupted by the receiver interfaces 114. Elongate conductor strip segments 120 are mounted on the inside surface 116 of the receiver plate 112 are shaped to engage the receiver assemblies 104, as shown in FIGS. 6A-B, and extend between and electrically interconnect the receiver assemblies 104A-F (see FIG. 1). In one embodiment, the conductor strip segments 120 each comprise a copper strip 0.002" thick and 0.375" wide. These conductor strip segments 120 must be sufficiently robust to carry current generated by the assembly.

As further shown in FIG. 3A, each receiver interface 114 includes a central, generally circular receiver opening 122 and a number of arcuate slots 124 spaced from and positioned about the receiver opening 122. The slots 124 are shaped to provide a twist lock tab interface or bayonet connection and include a wide end 124a and a narrow end 124b (see also FIGS. 6A and 6B). Other types of interfaces may be used that provide a positive mechanical connection between the receiver interfaces 114 and the receiver assemblies 104, including snap fit, screws, adhesives, welding or other fittings or interfaces that are well known. The receiver opening 122 and slots 124 are designed to receive and lock in place the receiver assemblies 104 as shown in FIGS. 6A-B. The conductor strip segments 120 each terminate in tabs 126 that extend into the receiver openings 122 and engage the receiver assembly 104 when it is inserted into the opening 122 and engaged, as shown in FIGS. 6A-B and described in greater detail below.

FIG. 3B shows the outside 118 of the receiver plate 112. This side of the receiver plate 112 includes a seal groove 128 and seal 130 that may fit within the groove 128. The seal 130 surrounds the opening 122 and slots 124 and provides part of an air and thermal barrier between the housing 102 and receiver assembly 104. The seal 130 may be an O-ring formed of, for example, synthetic or natural rubber, nylon, or other material commonly used as a gasket seal.

The receiver assembly 102 is shown in exploded view in FIG. 4. The receiver assembly 102 may include a secondary optical element ("SOE") 132, a disk-shaped light shield 134, a pair of conductor clips 136, receiver 138, concentrator cell assembly ("CCA") 140, gasket 142 and heat sink assembly 144. As described in, for example, U.S. Patent Application Pub. No. 2010/0275972, the SOE 132 may focus light received by the optical elements 106 (see FIG. 1) and direct it onto the CCA 140. The light shield 134 may be positioned between the SOE 132 and CCA 140 and cover sensitive elements of the CCA 140, preventing damage due to highly focused solar energy. The light shield 134 allows light to focus onto the photovoltaic elements of the CCA 140, which generate electricity from the incoming solar energy.

The CCA 140 may be attached directly to the inner surface of the heat sink assembly 144 by a thermally conductive adhesive, and may include tape, glue, or other well-known or commercially available thermally conductive adhesive. The gasket 142 may be positioned between the heat sink assembly 144 and receiver 138 as a thermal barrier and prevents damage to the receiver 138 by heat from the heat sink assembly 144.

The conductor clips 136 are mounted on the receiver 138 and extend in a generally radial direction. The clips 136 are electrically connected to the CCA 140 at their radially inner ends and include enlarged, radially outer ends shaped to engage the conductor tabs 126 of the receiver interface 114 as shown in FIG. 6B. Receiver 138 provides engagement between the receiver assembly 102 and receiver interface 114, as shown in FIGS. 6A-B.

As further shown in FIG. 4, the receiver 138 may be generally annular in shape and shaped to engage the receiver interface 114 on the receiver plate 112. The receiver 138 may include a recessed cup 146 that receives the SOE 132 and attaches to other components as shown in FIGS. 5A-G. The receiver 138 may also include bayonet prongs 148 shaped to engage the receiver interface 114 as shown in FIGS. 6A-B and 7A-B. These bayonet prongs 148 each may include a stem 150 projecting from the receiver 138 and terminating in a tang 152 that extends outwardly from the stem 150. While the bayonet prongs 148 shown are one type of fastener that may be used, a number of different types of fasteners may be substituted to accomplish the desired result. For example, screw fasteners, pins, snap fasteners, adhesives, or other fasteners may be used without departing from the scope of the invention.

Figure 5A:
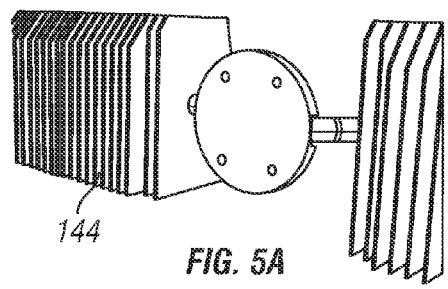
FIG. 5A is a perspective view showing a first stage of assembly of the receiver assembly of FIG. 4.
Figure 5B:
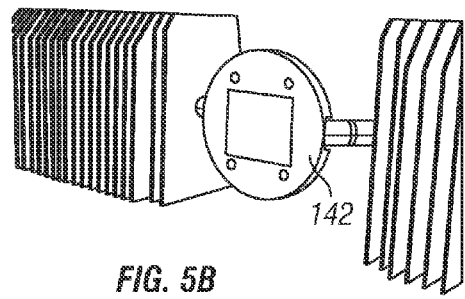
FIG. 5B is a perspective view showing a second stage of assembly of the receiver assembly of FIG. 4.
Figure 5C:
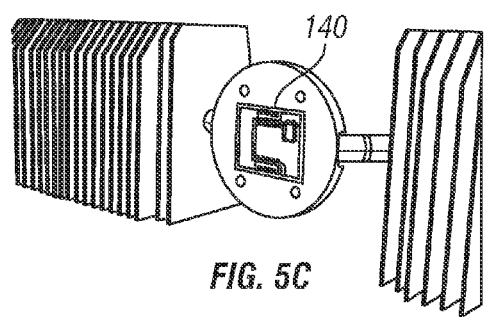
FIG. 5C is a perspective view showing a third stage of assembly of the receiver assembly of FIG. 4.
Figure 5D:
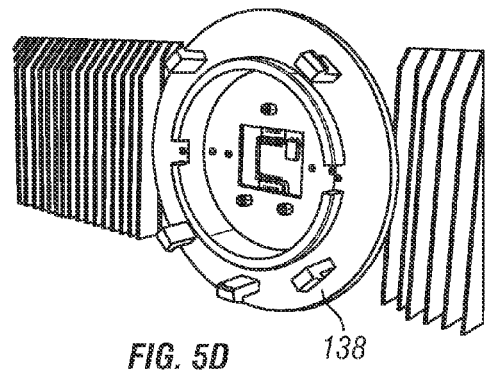
FIG. 5D is a perspective view showing a fourth stage of assembly of the receiver assembly of FIG. 4.
Figure 5E:
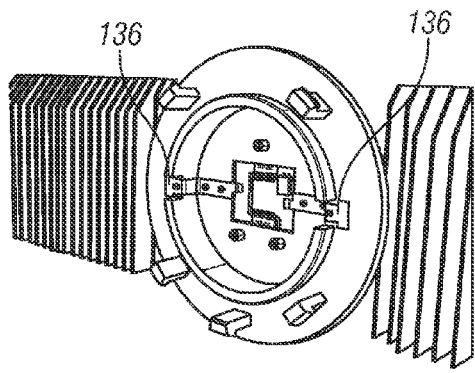
FIG. 5E is a perspective view showing a fifth stage of assembly of the receiver assembly of FIG. 4.
Figure 5F:
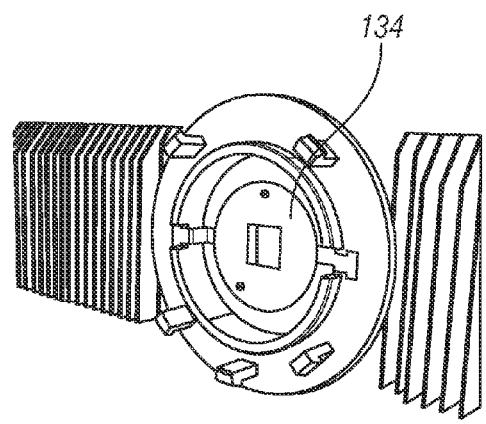
FIG. 5F is a perspective view showing the sixth stage of assembly of the receiver assembly of FIG. 4.
Figure 5G:
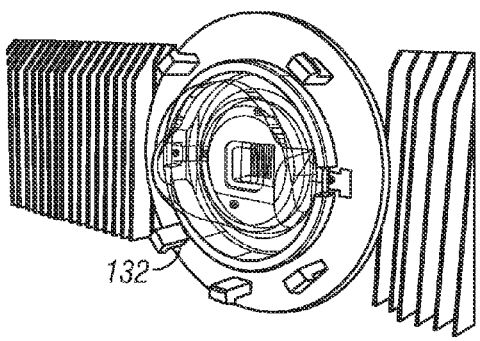
FIG. 5G is a perspective view showing the seventh stage of assembly of the receiver assembly of FIG. 4.

Assembly of the receiver assembly 102 is generally demonstrated in FIGS. 5A-G. FIG. 5A shows the heat sink assembly 144 to which the other components are attached. FIG. 5B shows the gasket 142 attached to the heat sink assembly 144. In FIG. 5C, the CCA 140 is positioned on the heat sink assembly 144. In FIG. 5D, the receiver cup 138 is positioned about the CCA 140 and is thermally isolated from the heat sink 144 by the gasket 142. In FIG. 5E, the conductors 136 have been attached to the receiver 138 and electrically engage the CCA 142 to conduct electricity away from the CCA 142. In FIG. 5F, the light shield 134 has been added, providing a barrier that only allows sunlight to impact the photovoltaic elements of the CCA 140. Finally, in FIG. 5G, the SOE 142 has been attached to the receiver 138 to further focus incident light onto the CA 140.

FIGS. 6A-B show the method of attaching a receiver assembly 104 to the receiver interface 114 at the inside surface 116 of the receiver plate 112. The receiver assembly 104 is positioned adjacent the opening 122 in the receiver plate 112 and is inserted into the receiver interface 114. The bayonet prongs 148 are inserted into the enlarged ends 124a of the slots 124. The wide end 124a of the slot 124 is sized to receive the tangs 152 of the bayonet prongs 148. As shown in FIG. 6B, the receiver assembly 104 is then rotated (counterclockwise as shown in FIGS. 6A and 6B) so that the bayonet prongs 148 engage the narrow ends 124b of the slots 124, which are sized to receive the stems 150 of the bayonet prongs 148. In this orientation, the tangs 152 prevent the removal of the bayonet prongs 148 from the slots 124, and therefore prevent removal of the receiver assembly 104 from the receiver interface 114.

As further shown in FIGS. 6A-B, as the receiver assembly 104 is rotated relative to the receiver interface 114, the conductor clips 136 on the receiver assembly 104 engage the conductor tabs 126 on the receiver interface. The conductor clips 136 preferably include a spring component, either as a separate piece or as part of the clip itself, that is biased towards engagement with the conductor tabs 126. In the embodiment shown, the clips 136 are biased away from the inside surface 116 and engage the tabs 126 when the receiver assembly 104 is secured in place. However, those having skill in the art may appreciate that other types of tabs 126 and clips 136 may be used without departing from the scope of the invention. For example, the clips 136 may be spring-biased radially outward from the assembly, biased towards the inside surface 116, or may alternatively be secured by screws or other fittings.

Figure 7A:
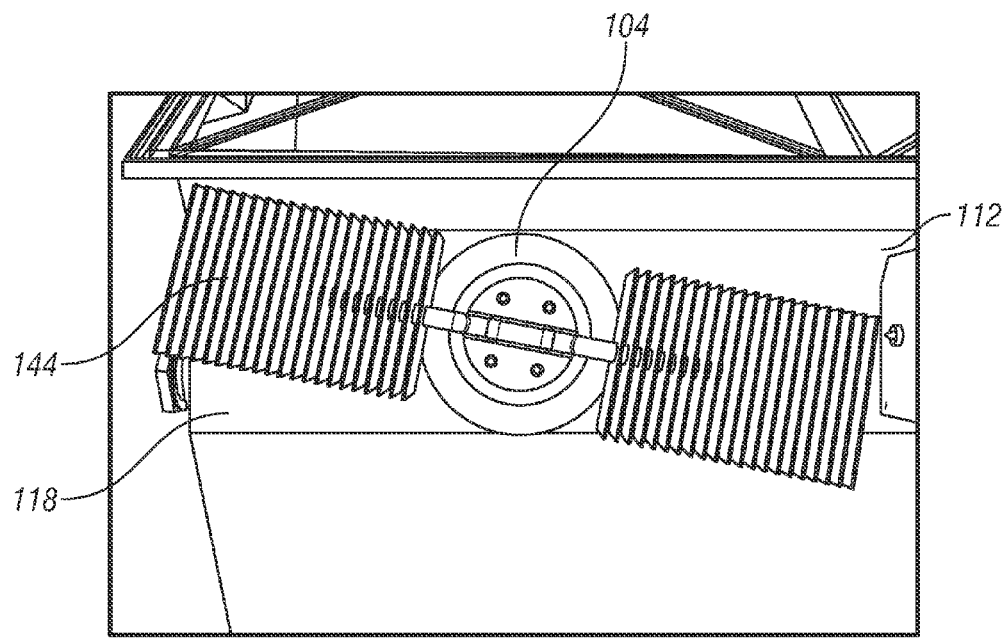
FIG. 7A is a bottom perspective view showing the attachment of the receiver assembly to the receiver plate.
Figure 7B:
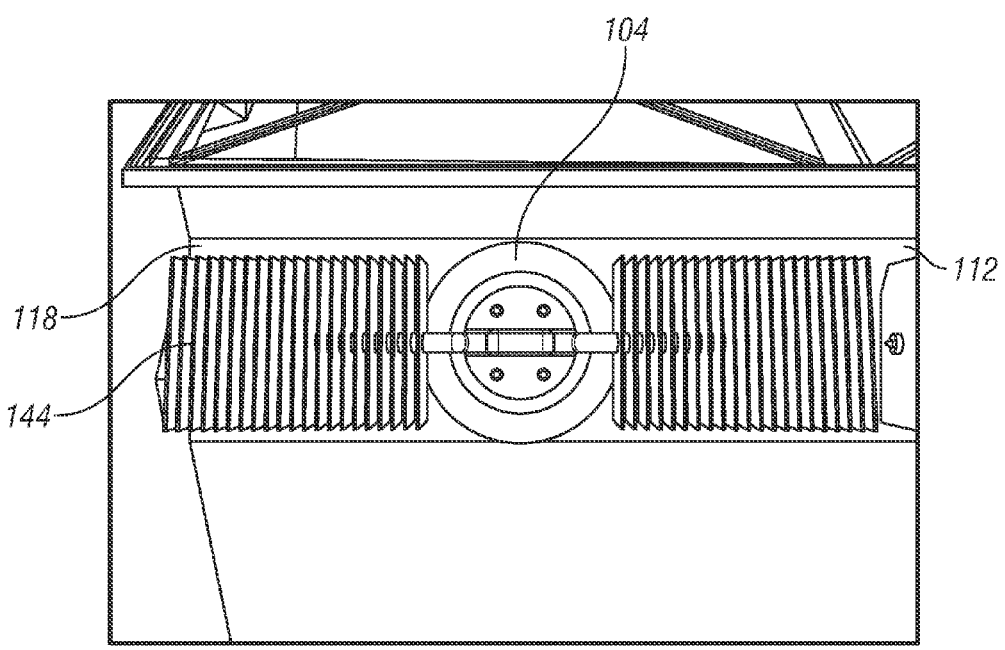
FIG. 7B is a bottom perspective view showing the attachment of the receiver assembly to the receiver plate.

FIGS. 7A-B show the receiver assembly 104 being secured to the receiver interface 114 from the outside surface 118 of the receiver plate 112. In this view, the heat sink assemblies 144 are visible and are rotated from approximately 10° offset from a long axis of the receiver plate 112 to approximately parallel to the receiver plate 112. When fully assembled, the heat sink assemblies 144 preferably are located external to the housing 102, thereby allowing maximum dissipation of heat from the CCA 140.

While the forms of apparatus described herein constitute preferred embodiments of the invention, it should be understood that the invention should not be limited to these precise embodiments, and variations may be made thereto without departing from the scope of the invention.

What is claimed is:

1. A solar collector array comprising:
   a housing having a first optical element and a receiver plate, the receiver plate having an opening therethrough, a seal groove surrounding said opening, and conductor strip segments positioned on an inside surface thereof adjacent said opening, said conductor strip segments running substantially a length of said receiver plate and terminating in a pair of tabs extending into said opening;
   a modular solar collector having a receiver and a heat sink assembly, said modular solar array shaped to be inserted into said opening and mounted on said housing, said modular solar collector including a pair of conductor clips shaped and positioned to engage and form an electrical connection with said conductor strip segments, said modular solar collector including a concentrator cell assembly connected to said conductor clips so that said pair of conductor clips connects said concentrator cell assembly to said conductor strip segments, said modular solar collector including a gasket attached to said heat sink assembly, wherein said receiver is thermally isolated from said heat sink by said gasket; and
   a seal mounted on said housing around said seal groove of said housing and positioned to extend around said opening, said seal providing a thermal and environmental barrier between said modular solar collector and said housing.

2. The solar collector array of claim 1, wherein said concentrator cell assembly includes a photovoltaic cell for converting incident solar radiation to electrical energy.

3. The solar collector array of claim 2, wherein said modular solar collector includes a heat sink in direct thermal contact with said photovoltaic cell.

4. The solar collector array of claim 3, wherein said modular solar collector includes a secondary optical element for directing solar energy onto said photovoltaic cell.

5. The solar collector array of claim 1, wherein said modular solar collector includes a receiver.

6. The solar collector array of claim 5, wherein said receiver includes a plurality of bayonet fittings and said receiver plate has a plurality of slots for receiving said bayonet fittings.

7. The solar collector array of claim 1, wherein said pair of conductor clips are spring-biased away from said inside surface and engage said tabs.

8. The solar collector array of claim 7, wherein said modular solar connector is shaped to be inserted into said opening and rotated to engage said spring-biased clips with said electrical element.

* * * * *